US008859891B2

(12) United States Patent
Duesterhoeft et al.

(10) Patent No.: US 8,859,891 B2
(45) Date of Patent: Oct. 14, 2014

(54) SOCKET ASSEMBLY FOR A PHOTOVOLTAIC PACKAGE

(75) Inventors: Scott Stephen Duesterhoeft, Etters, PA (US); Stephen Daniel Gherardini, Harrisburg, PA (US); Henry Otto Herrmann, Jr., Elizabethtown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 605 days.

(21) Appl. No.: 12/713,885

(22) Filed: Feb. 26, 2010

(65) Prior Publication Data

US 2011/0209758 A1    Sep. 1, 2011

(51) Int. Cl.
*H01L 31/00* (2006.01)
*H01L 31/052* (2014.01)
*H01L 31/048* (2014.01)

(52) U.S. Cl.
CPC ............ *H01L 31/052* (2013.01); *H01L 31/048* (2013.01); *H01L 31/0525* (2013.01); *Y02E 10/52* (2013.01)
USPC .......................................... 136/259; 136/252

(58) Field of Classification Search
USPC ........ 136/244, 246, 252, 259; 438/51, 64, 65, 438/116, 121–123; 174/53–64, 520–538, 174/548, 549, 559–563; 257/680, 685, 690, 257/696, 718, 719, 720, 727, 732
See application file for complete search history.

(56) References Cited

U.S. PATENT DOCUMENTS

| | | | | |
|---|---|---|---|---|
| 4,827,386 A | * | 5/1989 | Mackiewicz | 362/267 |
| 4,830,678 A | * | 5/1989 | Todorof et al. | 136/259 |
| 6,294,724 B1 | * | 9/2001 | Sasaoka et al. | 136/259 |
| 6,521,823 B2 | * | 2/2003 | Kubota et al. | 136/246 |
| 8,026,440 B1 | * | 9/2011 | Gordon | 136/259 |
| 2005/0072458 A1 | * | 4/2005 | Goldstein | 136/251 |
| 2009/0120500 A1 | * | 5/2009 | Prather et al. | 136/259 |
| 2009/0159125 A1 | * | 6/2009 | Prather et al. | 136/259 |
| 2011/0067758 A1 | * | 3/2011 | Plesniak | 136/259 |

FOREIGN PATENT DOCUMENTS

DE    102008035735 A1    2/2010
WO    9118419 A1    11/1991

OTHER PUBLICATIONS

International Search Report, International Application No. PCT 2011/000337, International Filing Date, Feb. 24, 2011.

* cited by examiner

*Primary Examiner* — Jonathan Johnson
*Assistant Examiner* — Angelo Trivisonno

(57) ABSTRACT

A socket assembly includes a photovoltaic package having a substrate with a photovoltaic cell and contact pads electrically connected to the photovoltaic cell. A dielectric housing removably receives the photovoltaic package. The dielectric housing holds contacts in mating engagement with the contact pads. A metal shell receives the housing and the photovoltaic package, and the metal shell has a window providing access to the photovoltaic cell.

19 Claims, 14 Drawing Sheets

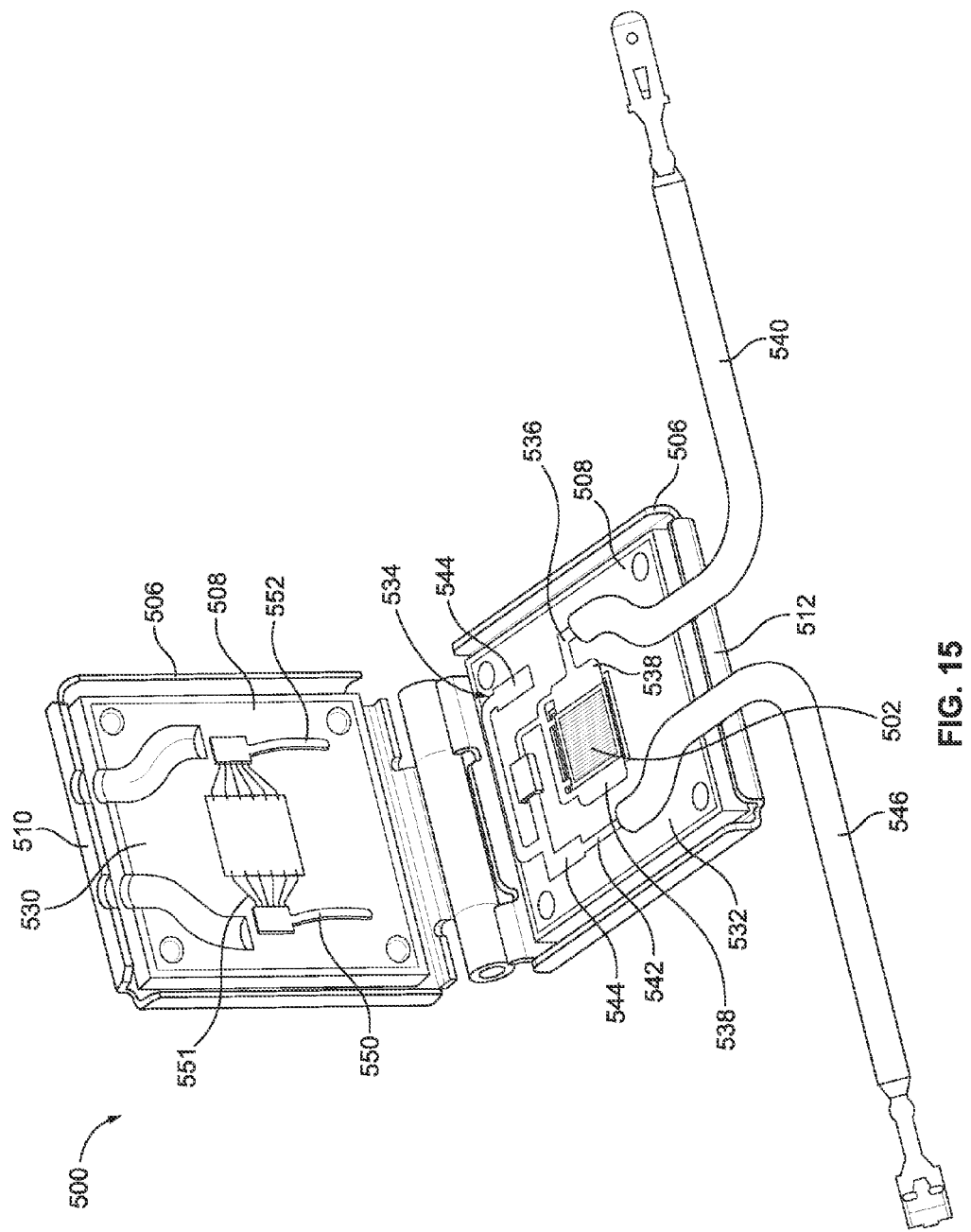

SOCKET ASSEMBLY FOR A PHOTOVOLTAIC PACKAGE

BACKGROUND OF THE INVENTION

The subject matter herein relates generally to photovoltaic packages, and more particularly, to socket assemblies for photovoltaic packages.

Power generation systems are known using photovoltaic packages having arrays of cells containing a solar photovoltaics material that converts solar radiation into direct current electricity. The photovoltaic packages are also typically combined into an array of many photovoltaic packages. In order to increase power generation, some systems have been developed that increase light intensity on the cells, resulting in increased efficiency. Such systems are sometimes called "concentrator systems". The increase in intensity is typically accomplished by using concentrating optics made up of a large area of lenses or mirrors that focus sunlight on a small area of the photovoltaic cells. Such systems also typically include tracking systems that track the location of the sun and move the arrays into position for high precision.

Known concentrator systems are not without disadvantages. For instance, the focused sunlight creates an extremely high amount of heat at the focus point. Problems arise in dissipating heat from the photovoltaic packages. Additionally, problems arise when the photovoltaic packages are not properly positioned with the light being focused on portions of the photovoltaic packages other than the photovoltaic cells. For example, when the tracking system is unable to properly track the sun, such as when clouds block the sun. Damage may be caused when the light is focused on portions of the photovoltaic packages other than the photovoltaic cells.

Other known problems with photovoltaic packages arise from the designs of the photovoltaic packages. For example, typically, wires are terminated directly to the photovoltaic packages, such as by being soldered to the substrate. Such assembly is time consuming and potentially unreliable, such as if an incomplete soldering joint is created. Additionally, when the photovoltaic package fails, the wires are cut and then connected to a replacement package. However, if too much of the wires are cut, or if the wires are too short, then the system may need to be rewired. As such, known photovoltaic packages have problems with repairability.

A cost effective and reliable solar power generation system is needed. A system is needed that addresses the heat dissipation issues with known solar power generation systems. A system is needed that addresses repairability and assembly issues with known photovoltaic packages.

BRIEF DESCRIPTION OF THE INVENTION

In one embodiment, a socket assembly is provided including a photovoltaic package having a substrate with a photovoltaic cell and contact pads electrically connected to the photovoltaic cell. A dielectric housing removably receives the photovoltaic package. The dielectric housing holds contacts in mating engagement with the contact pads. A metal shell receives the housing and the photovoltaic package, and the metal shell has a window providing access to the photovoltaic cell.

In another embodiment, a socket assembly is provided for mounting a photovoltaic package to a heat sink. The socket assembly includes a dielectric housing configured to hold the photovoltaic package. The dielectric housing holds contacts having mating interfaces that define a separable interface being configured for mating engagement with contact pads of the photovoltaic package. A metal shell receives the housing. The shell has mounting features for mounting to the heat sink such that the photovoltaic package is in thermal communication with the heat sink.

In a further embodiment, a socket assembly is provided including a photovoltaic package having a substrate with an upper surface and a lower surface. The photovoltaic package has a photovoltaic cell and contact pads electrically connected to the photovoltaic cell on the upper surface. The lower surface is configured to be in thermal communication with a heat sink. A dielectric housing holds the photovoltaic package. The dielectric housing also holds contacts in mating engagement with the contact pads. A metal shell receives the housing and the photovoltaic package. The metal shell has mounting features for mounting the metal shell, housing and photovoltaic package to the heat sink such that the photovoltaic package is in thermal communication with the heat sink.

BRIEF DESCRIPTION OF THE DRAWINGS

FIG. 15 illustrates an alternative connection arrangement for the socket assembly and photovoltaic package.

DETAILED DESCRIPTION OF THE INVENTION

Figure 1:
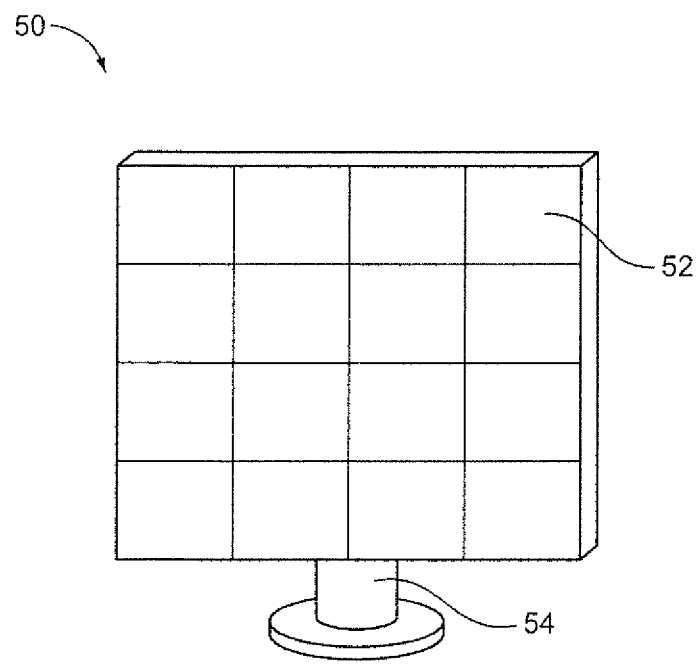
FIG. 1 illustrates a solar power generation system using concentrating photovoltaic modules formed in accordance with an exemplary embodiment.

FIG. 1 illustrates a solar power generation system 50 using concentrating photovoltaic modules 52 formed in accordance with an exemplary embodiment. The modules 52 are arranged in a carrier 54 that includes a tracking system that allows the modules 52 to move and track the position of the sun. The modules 52 focus light on photovoltaic cells of photovoltaic packages, such as the photovoltaic package 102 shown in FIG. 2, to generate direct current electricity.

Figure 2:
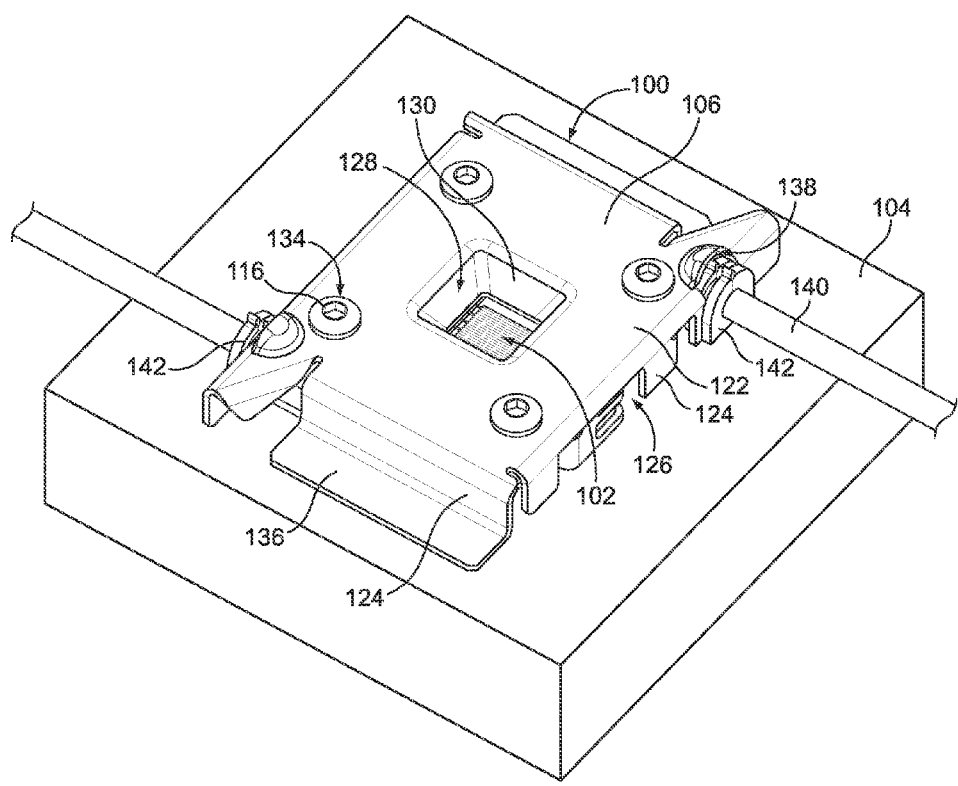
FIG. 2 is a top perspective view of a portion of one of the modules shown in FIG. 1 illustrating a socket assembly and photovoltaic package.
Figure 3:
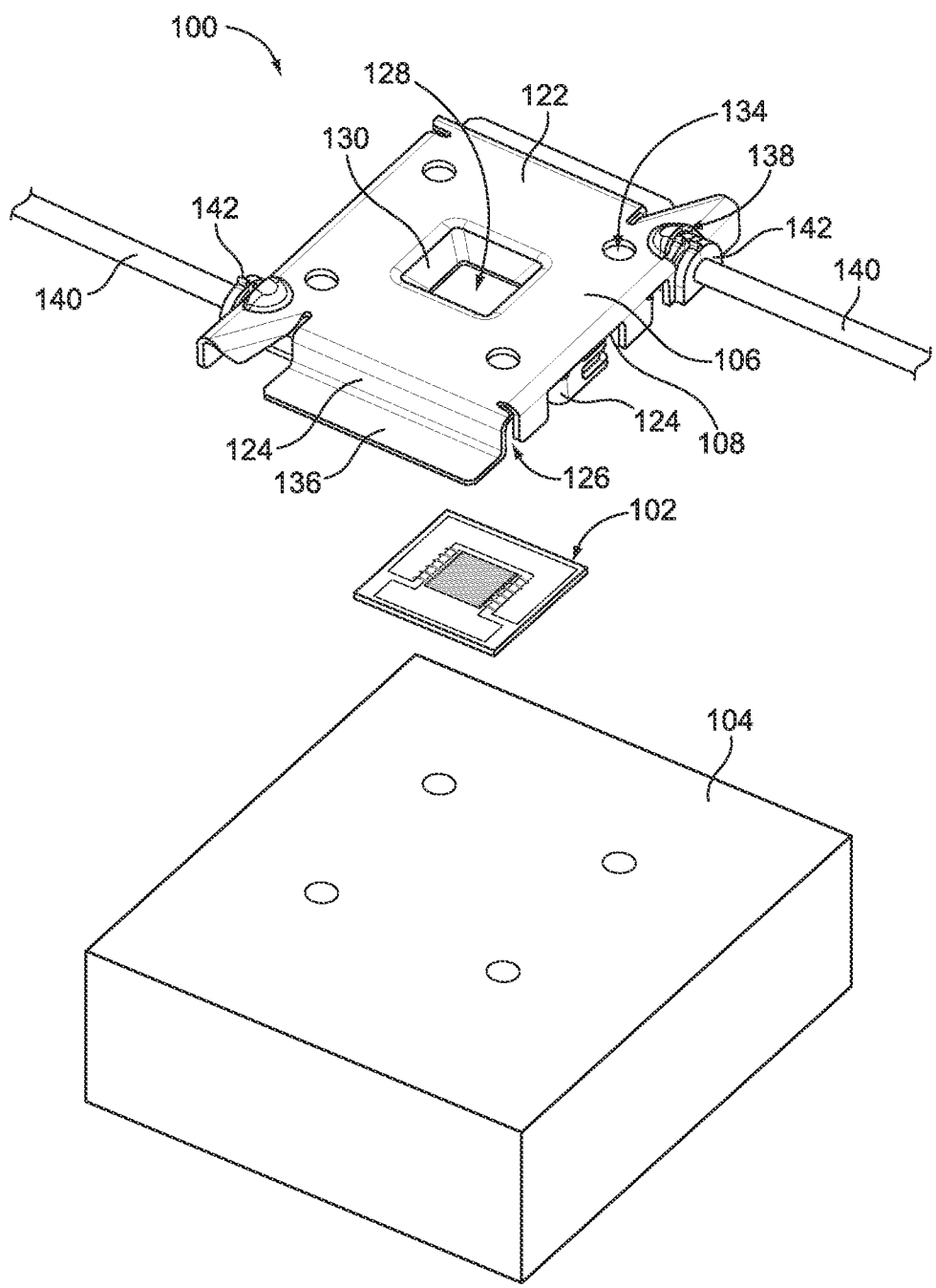
FIG. 3 is an exploded view of the socket assembly and photovoltaic package shown in FIG. 2.

FIG. 2 is a top perspective view of a portion of one of the modules 52 (shown in FIG. 1) illustrating a socket assembly 100 and photovoltaic package 102. FIG. 3 is an exploded view of the socket assembly 100 and photovoltaic package 102.

The socket assembly 100 and photovoltaic package 102 are mounted to a heat sink 104, which also forms part of the module 52. The heat sink 104 dissipates heat from the photovoltaic package 102 and/or the socket assembly 100.

The socket assembly 100 includes a shell 106 and a housing 108 held within the shell 106. The photovoltaic package 102 may also be held within the shell 106. The shell 106 exposes only a portion of the photovoltaic package 102, while shielding the rest of the photovoltaic package 102 and the housing 108. For example, the shell 106 shields the photovoltaic package 102 and housing 108 from intense light that may be improperly focused. When the light is focused on the shell 106 and/or when stray light is shed on the shell 106, the shell 106 may heat up. In an exemplary embodiment, the shell 106 is in thermal contact with the heat sink 104 such that the shell 106 defines a thermal conduit for transfer of excess thermal energy to the heat sink 104.

In an exemplary embodiment, the shell 106 may be mounted directly to the heat sink 104. Alternatively, a separate component, such as a positioning plate, may be provided on the heat sink 104, where the shell 106 is mounted to the positioning plate. In an exemplary embodiment, the shell 106 is manufactured from a metal material, such as a copper material, an aluminum material, a stainless steel material, and the like.

The photovoltaic package 102 may be directly coupled to the heat sink 104, and then the shell 106 mounted over the photovoltaic package 102. Alternatively, the photovoltaic package 102 may be removably received in the shell 106 and mounted to the heat sink 104 with the shell 106. Features may be provided to secure the photovoltaic package 102 to the heat sink 104 and/or to the shell 106. The photovoltaic package 102 may be removed from the heat sink 104 and/or the shell 106, such as for repair and/or replacement. Keying features may be provided to ensure proper positioning of the photovoltaic package 102 with respect to the shell 106.

The photovoltaic package 102 rests directly on the heat sink 104. For example, the bottom of the photovoltaic package 102 may be substantially flush with the bottom of the shell 106 along the heat sink 104. The photovoltaic package 102 is thus in direct thermal contact with the heat sink 104. Excessive heat conveyed into the photovoltaic package 102 from the focused sunlight is dissipated through the photovoltaic package 102 into the heat sink 104. Optionally, the heat sink 104 may be elevated, at least partially, into the shell 106 to make thermal contact with the photovoltaic package 102. Optionally, thermal grease may be provided on the heat sink 104, where the photovoltaic package 102 is set in the thermal grease. Thermally conductive pads or other thermal gap fillers may be used between the photovoltaic package 102 and the heat sink 104.

The heat sink 104 may include positioning features, such as pegs, protrusions, or recesses to position the photovoltaic package 102, the housing 108 and/or the shell 106 during assembly. The positioning features may have any size and shape to interact with the housing 108. The positing features may be located to define keying features that ensure proper orientation of the housing 108 and/or shell 106.

The shell 106 includes an upper wall 122 and side walls 124. The shell 106 defines a chamber 126 that receives the housing 108. A window 128 is provided in the shell 106 to expose a portion of the photovoltaic package 102. The window 128 includes window walls 130 extending between the upper wall 122 and the photovoltaic package 102. The window walls 130 extend down to the vicinity of the photovoltaic package 102 without touching it. The window walls 130 are angled with respect to the upper wall 122 at a predetermined angle. The angle may be approximately 30 degrees from vertical. Other angles are possible in alternative embodiments. The angle may be approximately perpendicular with respect to the upper wall 122 in some embodiments. The window walls 130 may reflect stray light toward the photovoltaic package 102. The angled window walls 130 may help to direct diffused light to the photovoltaic package 102.

The shell 106 includes mounting openings 134 that receive fasteners 116 to secure the socket assembly 100 to the heat sink 104. When the fasteners 116 are tightened, the fasteners 116 pull the upper wall 122 downward toward the heat sink 104. The force on the upper wall 122 is dissipated across the entire upper wall 122 such that the entire upper wall 122 presses downward on the housing 108 and the photovoltaic package 102 to ensure that the housing 108 is pressed against the photovoltaic package 102, which presses the photovoltaic package 102 against the heat sink 104.

The shell 106 includes tabs 136 that extend outward from corresponding side walls 124. The tabs 136 are flared outward to provide a large surface area for thermal communication with the heat sink 104. Excess thermal energy transferred to the shell 106 is dissipated down the side walls 124 into the tabs 136. The heat is then transferred into the heat sink 104 to lower the temperature of the shell 106. Optionally, when the fasteners 116 are tightened, the tabs 136 are biased against the heat sink 104 to ensure abutment of the tabs 136 with the heat sink 104.

The shell 106 includes wire channels 138 that receive wires 140 therein. The wires 140 form part of an electrical circuit electrically connected to the photovoltaic package 102. Strain relief elements 142 may be provided on the wires 140 to prevent damage to the wires 140.

Figure 4:
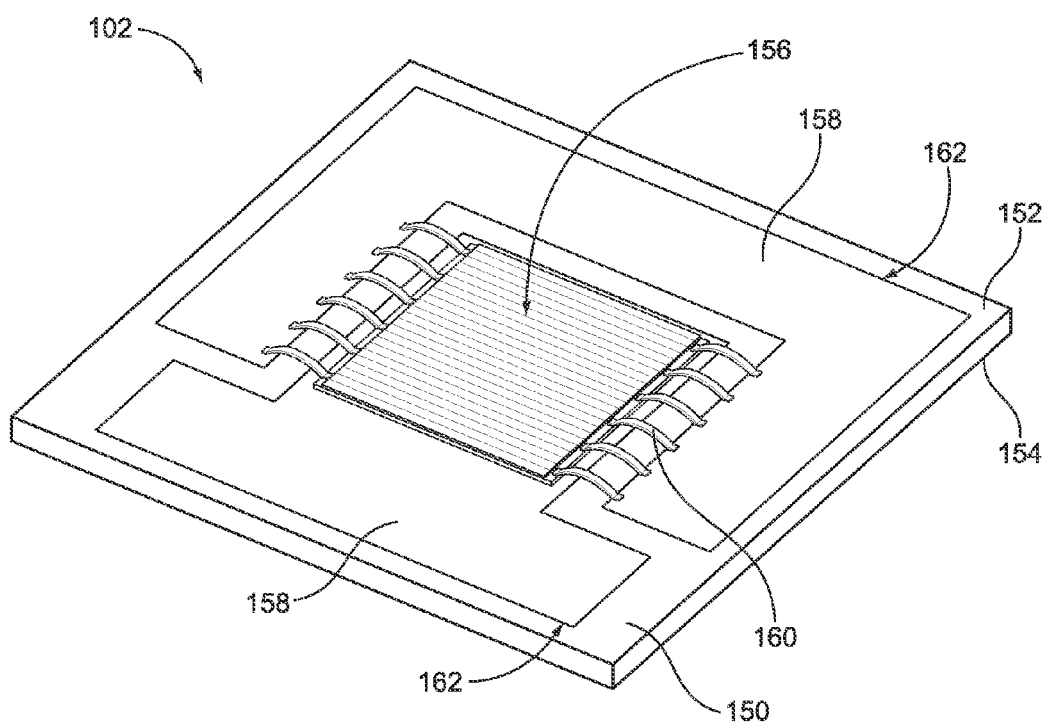
FIG. 4 is a top perspective view of the photovoltaic package shown in FIG. 2.

FIG. 4 is a top perspective view of the photovoltaic package 102. The photovoltaic package 102 is merely exemplary, and other types and configurations of photovoltaic packages may be used in alternative embodiments. The photovoltaic package 102 includes a substrate 150 having an upper surface 152 and a lower surface 154. A photovoltaic cell 156 and contact pads 158 are provided on the upper surface 152.

The photovoltaic cell 156 may be a semiconductor, manufactured from known photovoltaic materials, such as silicon (Si), indium gallium arsenide (InGaAs), Indium gallium phosphide (InGaP), germanium (Ge), or other semiconductor materials. The substrate 150 may be manufactured from materials that are highly thermally conductive to allow heat dissipation through the substrate 150. The substrate acts as a dielectric, isolating the contact pads 158 from the heat sink 104. The lower surface 154 is configured to be mounted to the heat sink 104 (shown in FIGS. 2 and 3) to dissipate heat from the substrate 150.

In the illustrated embodiment, the photovoltaic cell 156 is arranged generally in a center of the substrate 150. The contact pads 158 are also deposited on the upper surface 152. The photovoltaic cell 156 is electrically connected to the contact pads 158, which may define an anode or a cathode. In the illustrated embodiment, the photovoltaic cell 156 is mounted to one of the contact pads 158 and is connected to the other contact pad 158 by wire bonds 160. The contact pads 158 are copper traces on the upper surface 152. Optionally, the contact pads 158 may be plated, such as with gold, palladium, platinum or other metal plating. Other electrical components, such as diodes, may be connected to one or more of the contact pads 158.

Figure 5:
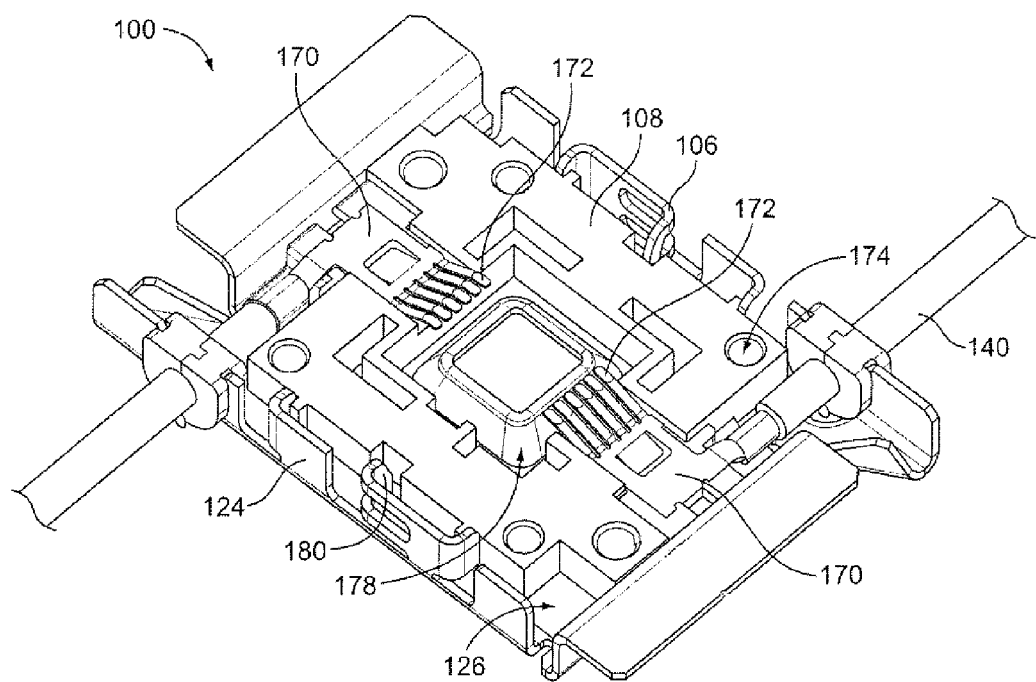
FIG. 5 is a bottom perspective view of a portion of the socket assembly shown in FIG. 2.

In an exemplary embodiment, the contact pads 158 define contact zones or areas 162 for mating with contacts 170 (shown in FIG. 5). The contact zones 162 are sized large enough to mate with the contacts 170. Optionally, the contact zones 162 are positioned proximate to opposite edges of the substrate 150.

FIG. 5 is a bottom perspective view of a portion of the socket assembly 100 illustrating the housing 108 received in the shell 106. The housing 108 is manufactured from a dielectric material, such as plastic. The housing 108 holds the contacts 170, which make electrical contact with the contact pads 158 (shown in FIG. 4) of the photovoltaic package 102 (shown in FIG. 4). The contacts 170 are terminated to corresponding wires 140. The wires 140 are terminated to the contacts 170 separate from the photovoltaic package 102. As such, no permanent connection is made between the wires 140 and the photovoltaic package 102. As such, the socket assembly 100 may be removed independently from photovoltaic package 102 without having to alter the wires 140.

The contacts 170 include multiple fingers 172 for making multiple points of contact with the contact pads 158. The multiple points of contact may lower the resistance across the interface between the contacts 170 and the contact pads 158. In an exemplary embodiment, the fingers 172 define springs that are configured to be biased against the contact pads 158 when the socket assembly 100 is assembled. For example, when the fasteners 116 (shown in FIG. 2) are tightened, the contacts 170 are pressed against the contact pads 158. The fingers 172 are flexed during such pressing, thereby spring loading the fingers 172 against the contact pads 158. The fingers 172 also provide a spring force to press the photovoltaic package 102 against the heat sink 104. The contacts 170 define a separable interface for mating with the photovoltaic package 102, such that the photovoltaic package 102 may be repeatedly coupled to, and uncoupled from, the contacts 170 without damaging the mating interfaces of the contacts 170 or the contact pads 158.

The housing 108 includes mounting openings 174 that receive the fasteners 116 therethrough. The mounting openings 174 are aligned with the mounting openings 134 (shown in FIGS. 2 and 3) of the shell 106. The housing 108 includes a central opening 178. The window walls 130 are received in the central opening 178. The distal ends of the fingers 172 are exposed within the central opening 178. Optionally, at least a portion of the photovoltaic package 102 may be received in the central opening 178, such as the photovoltaic cell 156 (shown in FIG. 4).

The side walls 124 of the shell 106 engage the housing 108 to hold the shell 106 in the chamber 126. Optionally, the side walls 124 may include projections 180 that extend into the chamber 126 to engage and position the housing 108. The projections 180 may operate as latches to hold the housing 108 within the chamber 126. As such, the housing 108 and shell 106 may be manipulated and handled as a single unit, such as during assembly onto the heat sink 104.

Figure 6:
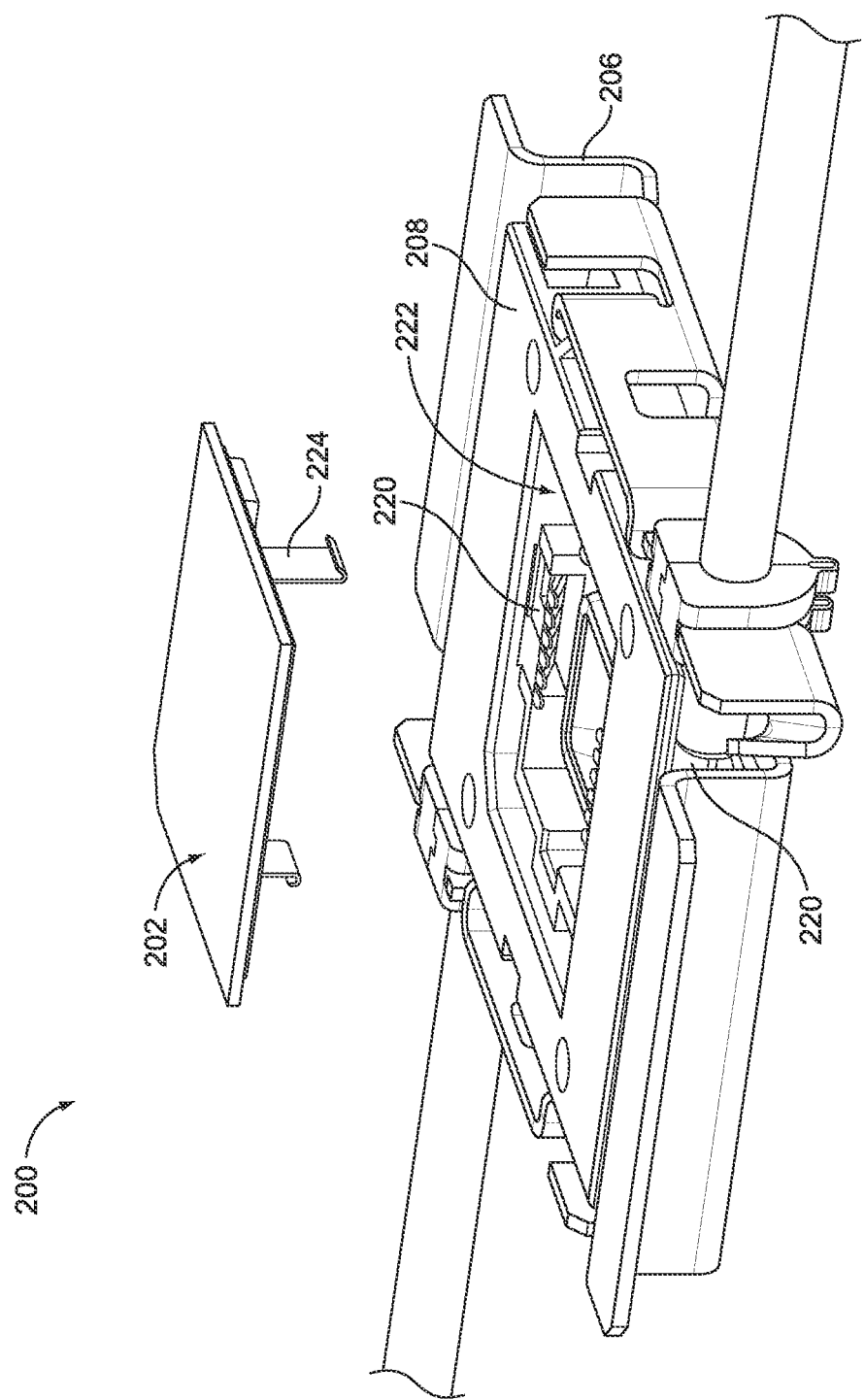
FIG. 6 is an exploded view of an alternative socket assembly and photovoltaic package formed in accordance with an alternative embodiment.

FIG. 6 is an exploded view of an alternative socket assembly 200 and a photovoltaic package 202 formed in accordance with an alternative embodiment. The socket assembly 200 and photovoltaic package 202 are configured to be mounted to the heat sink 104 (shown in FIG. 2). The heat sink 104 dissipates heat from the photovoltaic package 202 and/or the socket assembly 200.

The socket assembly 200 includes a shell 206 and a housing 208 held within the shell 206. The photovoltaic package 202 is also held within the housing 208. The shell 206 may be substantially similar to the shell 106. The shell 206 shields a large portion of the photovoltaic package 202 as well as substantially all of the housing 208. For example, the shell 206 shields portions of the photovoltaic package 202 and housing 208 from intense light that may be improperly focused or from incident light. When mounted to the heat sink 104, the shell 206 is in thermal contact with the heat sink 104 such that the shell 206 defines a thermal conduit for transfer of excess thermal energy to the heat sink 104.

The housing 208 is similar to the housing 108 (shown in FIG. 5. The housing 208 is manufactured from a dielectric material, such as plastic. The shell 206 receives and holds the housing 208 therein. The housing 208 holds a pair of contacts 220, which may be similar to the contacts 170 (shown in FIG. 5). The housing 208 includes a chamber 222 in a bottom of the housing 208 that receives the photovoltaic package 202. The chamber 222 is sized and shaped to receive the photovoltaic package 202. In an exemplary embodiment, the photovoltaic package 202 includes one or more latches 224 that engage the housing 208 to hold the photovoltaic package 202 in the chamber 222. For example, the latches 224 include hook ends that engage a portion of the housing 208 to secure the photovoltaic package 202 to the housing 208.

Figure 7:
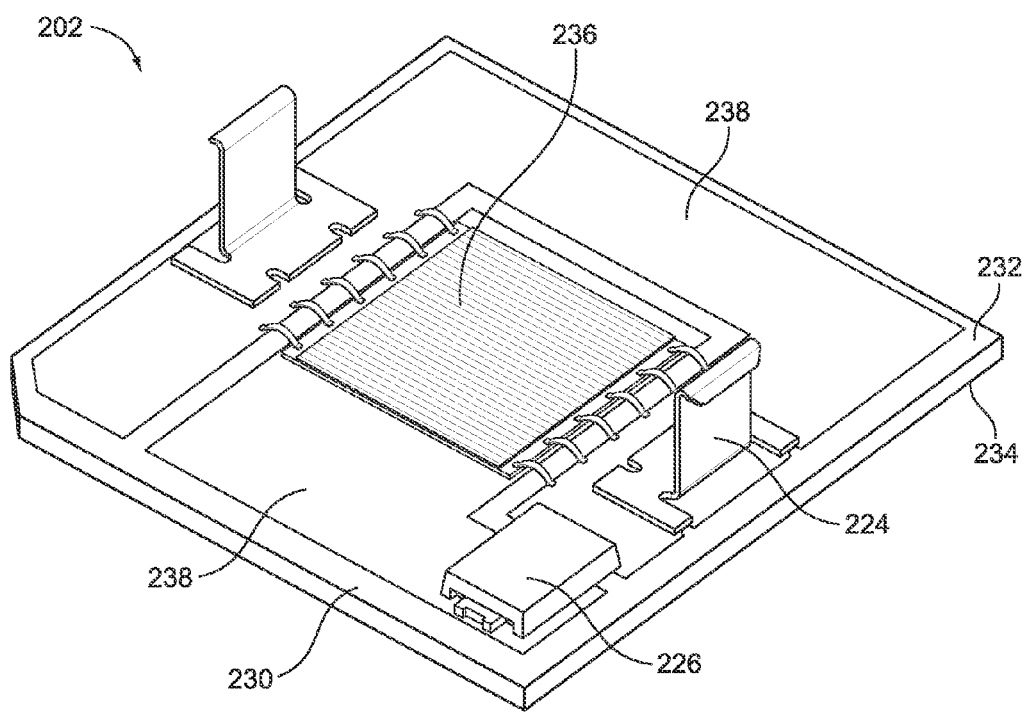
FIG. 7 is a top perspective view of the photovoltaic package shown in FIG. 6.

FIG. 7 is a top perspective view of the photovoltaic package 202. The photovoltaic package 202 is similar to the photovoltaic package 102 (shown in FIG. 4), however the photovoltaic package 202 includes the latches 224 and an electronic component 226, such as a diode or other electronic component. The photovoltaic package 202 includes a substrate 230 having an upper surface 232 and a lower surface 234. A photovoltaic cell 236 and contact pads 238 are provided on the upper surface 232 of the substrate 230. The contact pads 238 are configured to engage the contacts 220 (shown in FIG. 6) when the photovoltaic package 202 is assembled with the housing 208 (shown in FIG. 6). A separable interface is defined between the contacts 220 and the contact pads 238.

In the illustrated embodiment, the latches 224 are soldered to the contact pads 238. Alternative mounting means are possible in alternative embodiments. For example, the latches 224 may be mounted to the substrate 230, such as by defining clips that clip onto an edge of the substrate 230.

Figure 8:
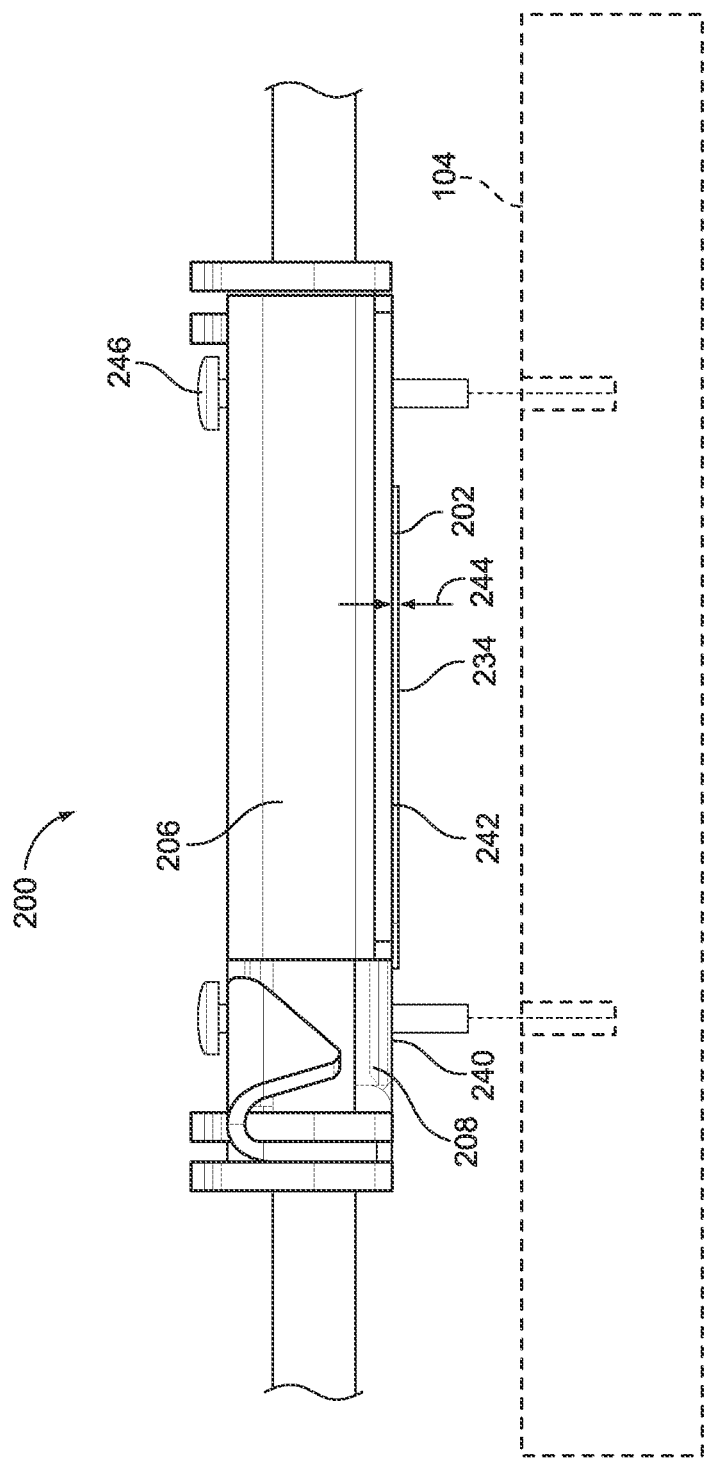
FIG. 8 is a side view of the socket assembly and photovoltaic package shown in FIG. 7.

FIG. 8 is a side view of the socket assembly 200 and photovoltaic package 202 being mounted to the heat sink 104. Prior to mounting, the socket assembly 200 and the photovoltaic package 202 to the heat sink 104, the housing 208 is loaded into the shell 206 and the photovoltaic package 202 is loaded into the housing 208. As such, the shell 206, housing 208 and photovoltaic package 202 may be manipulated and handled as a single unit, such as during assembly onto the heat sink 104.

A bottom 240 of the housing 208 is generally flush with a bottom 242 of the shell 206. As such, the bottom 242 of the shell 206 is capable of resting directly on the heat sink 104, which allows thermal transfer between the metal shell 206 and the heat sink 104.

In an exemplary embodiment, prior to mounting to the heat sink 104, a portion of the photovoltaic package 202 extends from the bottom 240 of the housing 208. For example, the lower surface 234 of the photovoltaic package 202 is recessed below the bottom 240 of the housing 208 by a predetermined amount represented by arrow 244. During mounting of the socket assembly 200 to the heat sink 104, the photovoltaic package 202 is pressed into the housing 208 until the bottom 242 of the shell 206 engages the heat sink 104. As the photovoltaic package 202 is pressed into the housing 208, the contact pads 238 (shown in FIG. 7) are pressed against the contacts 220 (shown in FIG. 6). Such action loads the contacts 220 against the contact pads 238 with a biasing force to ensure good contact therebetween. Optionally, tightening of fasteners 246 to the heat sink 104 causes the shell 206 and housing 208 to move downward toward the heat sink 104. Such action causes the photovoltaic package 202, which engages the heat sink 104 prior to the bottoms 240, 242 engaging the heat sink 104, to be pressed into the housing 208. The shell 206 spreads the forces from the fasteners 246 across the entire upper surface of the shell 206 downward onto the housing 208. The downward force of the housing 208 causes the contacts 220 to press against the contact pads 238.

Figure 9:
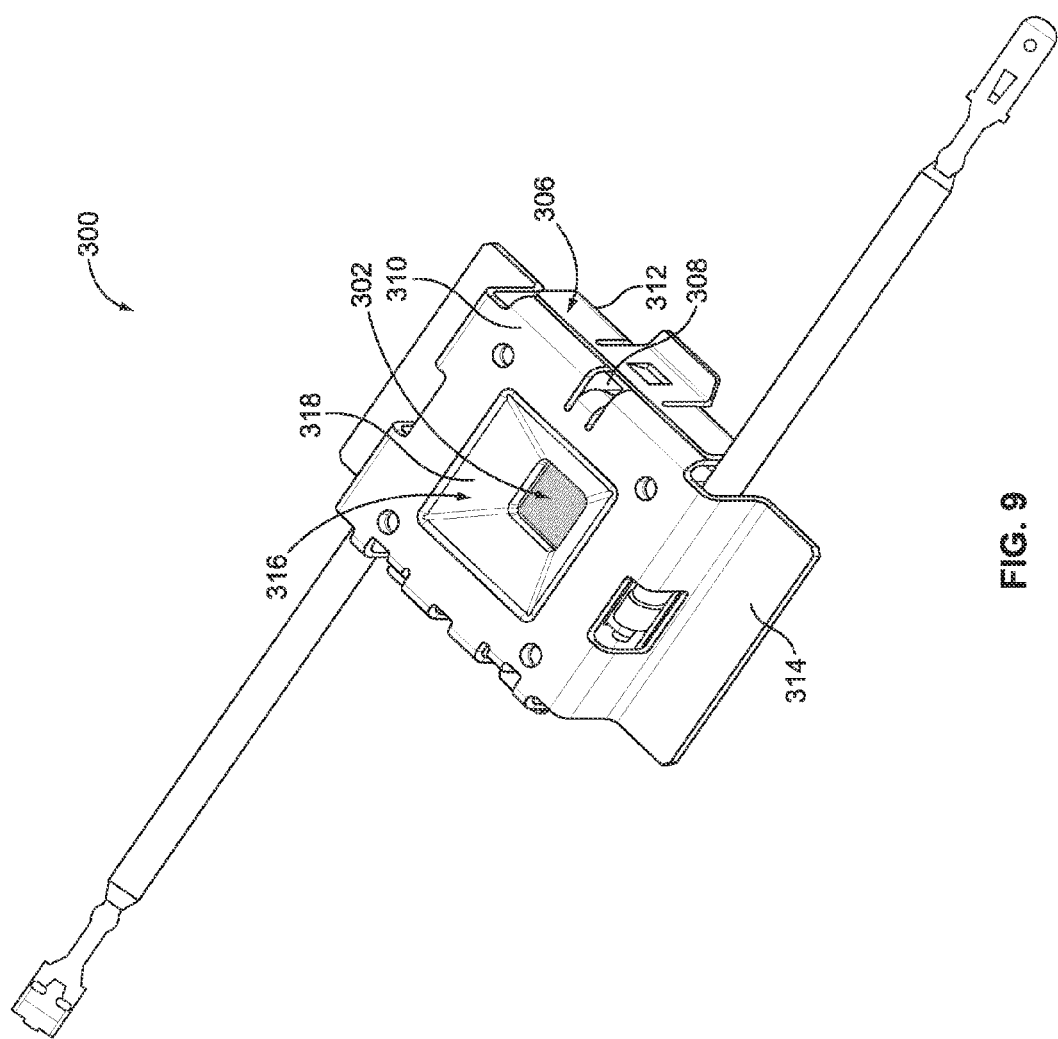
FIG. 9 is a top perspective view of another alternative socket assembly and photovoltaic package.

FIG. 9 is a top perspective view of another alternative socket assembly 300 and photovoltaic package 302. The socket assembly 300 and photovoltaic package 302 are configured to be mounted to the heat sink 104. The heat sink 104 dissipates heat from the photovoltaic package 302 and/or the socket assembly 300.

The socket assembly 300 includes a shell 306 and a housing 308 held within the shell 306. The photovoltaic package 302 is also held within the shell 306. The shell 306 includes an upper shell 310 and a lower shell 312 coupled together. The shell 306 shields a large portion of the photovoltaic package 302 as well as substantially all of the housing 308.

When mounted to the heat sink 104, the shell 306 is in thermal contact with the heat sink 104 such that the shell 306 defines a thermal conduit for transfer of excess thermal energy to the heat sink 104. In an exemplary embodiment, the upper shell 310 includes tabs 314 that engage the heat sink 104 to dissipate heat from the upper shell 310 directly to the heat sink 104. The lower shell 312 engages the heat sink 104, and heat may be transferred from the upper shell 310 to the lower shell 312 and then into the heat sink 104.

A window 316 is provided in the upper shell 310 to expose a portion of the photovoltaic package 302. The window 316 includes window walls 318 extending down to the vicinity of the photovoltaic package 302. The window walls 318 do not touch the photovoltaic package 302. The window walls 318 may help deflect diffused light to the photovoltaic package 302.

Figure 10:
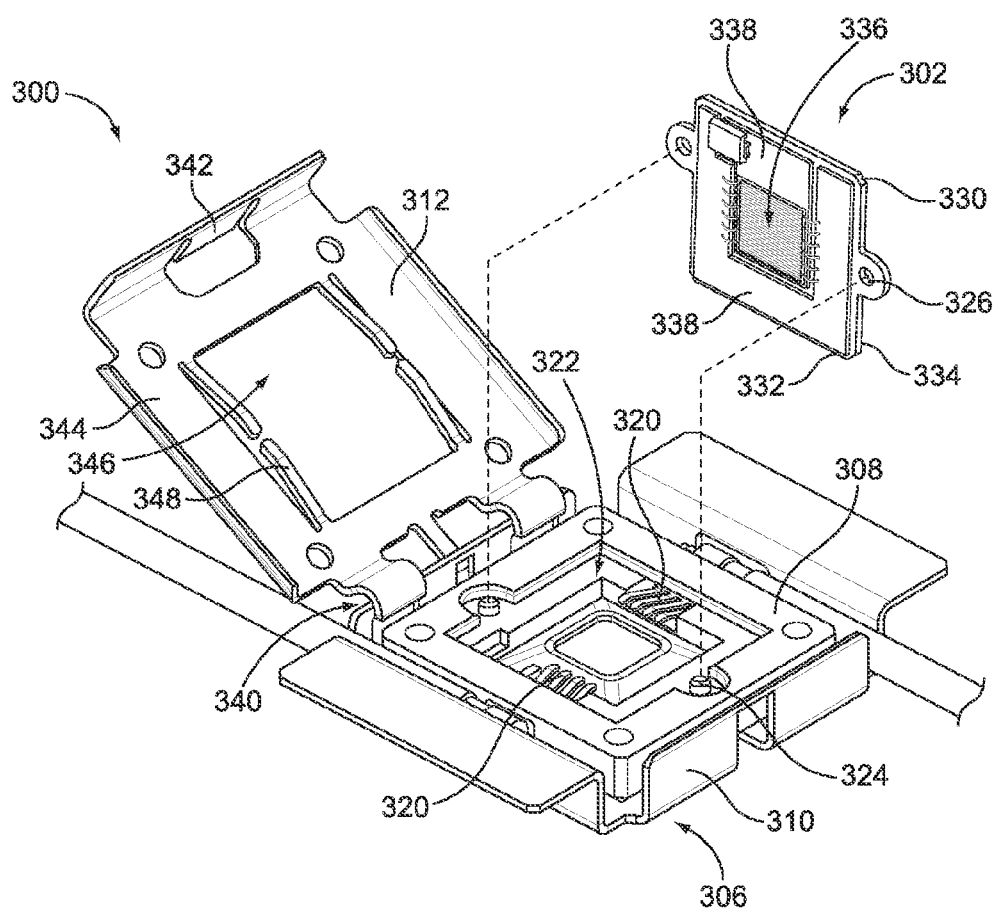
FIG. 10 is a partially assembled view of the socket assembly and photovoltaic package shown in FIG. 9.

FIG. 10 is a partially assembled view of the socket assembly 300 and photovoltaic package 302 illustrating the housing 308 received in the upper shell 310. The housing 308 is similar to the housing 108 (shown in FIG. 5. The housing 308 is manufactured from a dielectric material, such as plastic. The shell 306 receives and holds the housing 308 therein. The housing 308 holds a pair of contacts 320, which may be similar to the contacts 170 (shown in FIG. 5).

The housing 308 includes a chamber 322 in a bottom of the housing 308 that receives the photovoltaic package 302. The chamber 322 is sized and shaped to receive the photovoltaic package 302. The contacts 320 are exposed in the chamber 322 for mating with the photovoltaic package 302. The contacts 320 define a separable interface for mating with the photovoltaic package 302, such that the photovoltaic package 302 may be repeatedly coupled to, and uncoupled from, the contacts 320 without damaging the mating interfaces of the contacts 320 or the photovoltaic package 302. Additionally, the photovoltaic package 302 may be replaced with a different photovoltaic package 302, such as when one of the photovoltaic packages 302 is damaged.

In an exemplary embodiment, the housing 308 includes posts 324 that are received in corresponding openings 326 in the photovoltaic package 302 to locate the photovoltaic package 302 in the chamber 322. The posts 324 and openings 326 may be located to define keying features to properly orient the photovoltaic package 302 with respect to the housing 308.

The photovoltaic package 302 is similar to the photovoltaic package 102 (shown in FIG. 4). The photovoltaic package 302 includes a substrate 330 having an upper surface 332 and a lower surface 334. A photovoltaic cell 336 and contact pads 338 are provided on the upper surface 332 of the substrate 330. The contact pads 338 are configured to engage the contacts 320 when the photovoltaic package 302 is assembled with the housing 308.

During assembly, after the photovoltaic package 302 is loaded into the housing 308, the lower shell 312 may be closed. In an exemplary embodiment, the lower shell 312 is rotatably coupled to the upper shell 310 at a hinge 340. The lower shell 312 is rotated about the hinge 340 to a closed position. The lower shell 312 includes a latch 342 that engages the upper shell 310 to secure the lower shell 312 to the upper shell 310.

The lower shell 312 includes a bottom wall 344 that has an opening 346 therethrough. The lower surface 334 of the photovoltaic package 302 is exposed through the opening 346 when the socket assembly 300 is assembled, such as to engage the heat sink 104. In an exemplary embodiment, the lower shell 312 includes biasing fingers 348 arranged within the opening 346. The biasing fingers 348 are configured to engage the lower surface 334 of the photovoltaic package 302 to bias the photovoltaic package 302 toward the housing 308. Such biasing of the photovoltaic package 302 presses the photovoltaic package 302 against the contacts 320 to ensure good contact therebetween.

Figure 11:
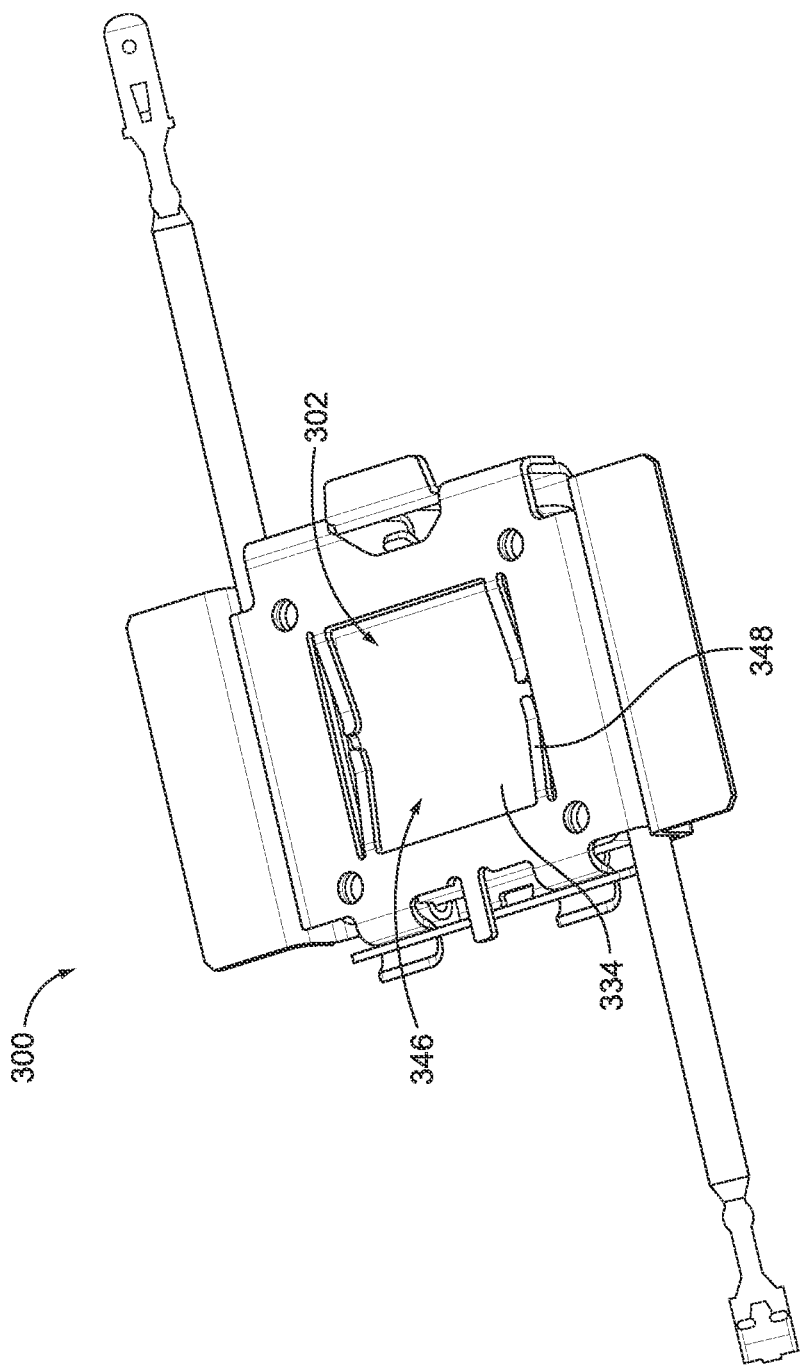
FIG. 11 is a bottom perspective view of the socket assembly and photovoltaic package shown in FIG. 9.

FIG. 11 is a bottom perspective view of the socket assembly 300 and photovoltaic package 302. The lower surface 334 of the photovoltaic package 302 is exposed through the opening 346. The biasing fingers 348 are pressed against the lower surface 334. The opening 346 is sized approximately the same as the lower surface 334 to ensure that a large surface area of the lower surface 334 is exposed therethrough for engaging the heat sink 104 (shown in FIG. 8).

Figure 12:
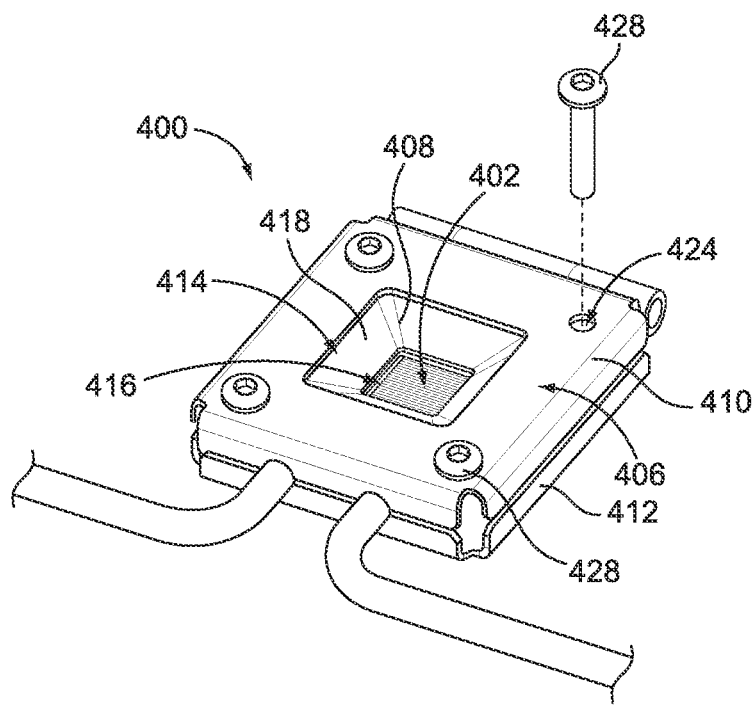
FIG. 12 is a top perspective view of an alternative socket assembly and photovoltaic package.
Figure 13:
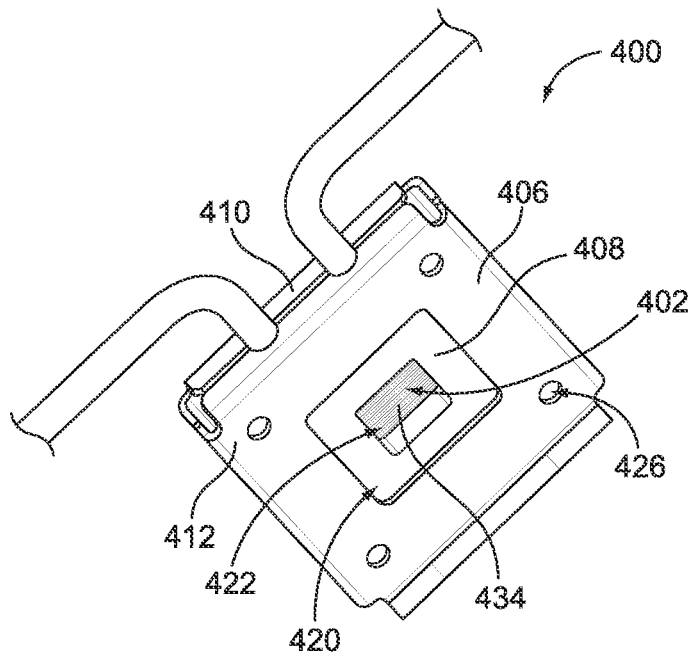
FIG. 13 is a bottom perspective view of the socket assembly and photovoltaic package shown in FIG. 12.

FIG. 12 is a top perspective view of an alternative socket assembly 400 and photovoltaic package 402. FIG. 13 is a bottom perspective view of the socket assembly 400 and photovoltaic package 402. The socket assembly 400 and photovoltaic package 402 are configured to be mounted to the heat sink 104. The heat sink 104 dissipates heat from the photovoltaic package 402 and/or the socket assembly 400.

The socket assembly 400 includes a shell 406 and a housing 408 held within the shell 406. The photovoltaic package 402 is also held within the shell 406. The shell 406 includes an upper shell 410 and a lower shell 412 coupled together. The shell 406 shields a large portion of the photovoltaic package 402 as well as substantially all of the housing 408. A window 414 is provided in the upper shell 410 to expose a portion of the photovoltaic package 402. A window 416 is provided in the housing 408 to expose a portion of the photovoltaic package 402. The window 416 is aligned with the window 414. The window 416 of the housing 408 includes window walls 418 extending down to the vicinity of the photovoltaic package 402.

The lower shell 412 includes an opening 420 therethrough exposing the housing 408 and the photovoltaic package 402. The housing 408 also includes an opening 422 through the bottom of the housing 408 exposing the lower surface 434 of the photovoltaic package 402. The lower surface 434 of the photovoltaic package 402 is thermally connected to the heat sink 104 through the openings 420, 422. For example, the heat sink 104 may include a protrusion (not shown) that extends into the openings 420, 422 to engage the lower surface 434 of photovoltaic package 402. Alternatively, a thermal interposer (not shown), which is separate and discrete from the photovoltaic package 402 and the heat sink 104, may be provided that is received in the openings 420, 422 to engage the photovoltaic package 402. The thermal interposer may engage the heat sink 104 at an end opposite the photovoltaic package 402 to dissipate heat from the photovoltaic package 402 to the heat sink 104.

Mounting openings 424, 426 are provided in the upper and lower shells 410, 412, respectively. The mounting openings 424, 426 receive fasteners 428 to couple the socket assembly 400 to the heat sink 104. The fasteners 428 securely couple the upper and lower shells 410, 412 together.

Figure 14:
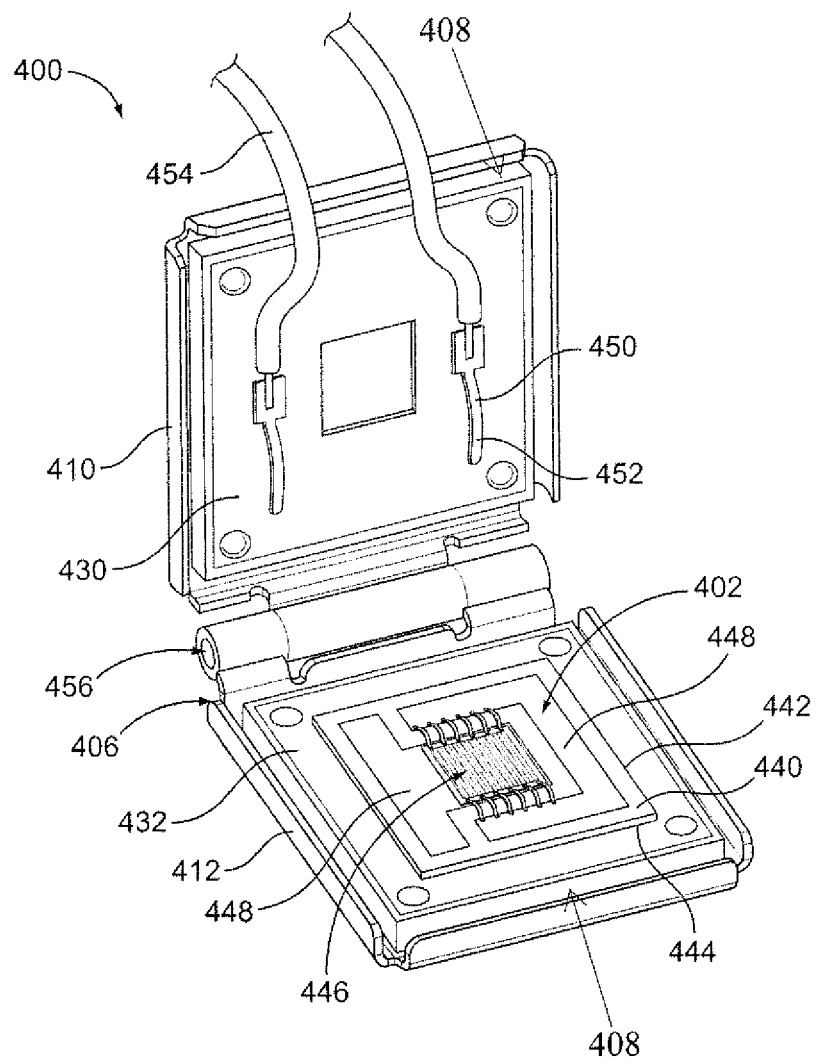
FIG. 14 is a partially assembled view of the socket assembly and photovoltaic package shown in FIG. 12.

FIG. 14 is a partially assembled view of the socket assembly 400 and photovoltaic package 402 in an open state. The housing 408 includes an upper housing 430 and a lower housing 432 received in the upper shell 410 and lower shell 412, respectively. The photovoltaic package 402 is provided on the lower housing 432. The photovoltaic package 402 includes a substrate 440 having an upper surface 442 and a lower surface 444. A photovoltaic cell 446 and contact pads 448 are provided on the upper surface 442 of the substrate 440. The photovoltaic cell 446 is configured to be exposed through the windows 414, 416 (shown in FIG. 12), while the other portions of the photovoltaic package 402, such as the contact pads 448 are not exposed through the windows 414, 416.

The upper housing 430 includes contacts 450 on an inner surface thereof. The contacts include spring fingers 452 that are configured to engage the contact pads 448 when the socket assembly is assembled. The spring fingers 452 define a separable interface for mating with the photovoltaic package 402, such that the photovoltaic package 402 may be repeatedly coupled to, and uncoupled from, the contacts 450 without damaging the mating interfaces of the contacts 450 or the contact pads 448. Additionally, the photovoltaic package 402 may be replaced with a different photovoltaic package 402, such as when one of the photovoltaic packages 402 is damaged. Wires 454 are terminated to the contacts 450, such as by a soldered connection. Other types of connections are possible in alternative embodiments. For example, the contacts 450 may be crimped to the wires 454 and held in place relative to the upper housing 430 for mating with the contact pads 448. The wires 454 are terminated to the contacts 450 separate from the photovoltaic package 402. As such, no permanent connection is made between the wires 454 and the photovoltaic package 402. As such, the photovoltaic package 402 may be removed independently from the wires 454 and without having to alter the wires 454.

In an exemplary embodiment, the lower shell 412 is rotatably coupled to the upper shell 410 at a hinge 456. The lower shell 412 is rotated about the hinge 456 to a closed position. The upper and/or lower shell 410, 412 may include a latch (not shown) to secure the lower shell 412 to the upper shell 410. Optionally, the upper and/or lower shell 410, 412 may include one or more tabs extending therefrom, similar to the tabs 136 (shown in FIGS. 2 and 3), for making thermal engagement with the heat sink 104.

FIG. 15 illustrates an alternative connection arrangement for a socket assembly 500 and a photovoltaic package 502. The socket assembly 500 includes a shell 506 and a housing 508 held within the shell 506. The photovoltaic package 502 is also held within the shell 506. The shell 506 includes an upper shell 510 and a lower shell 512 coupled together.

The housing 508 includes an upper housing 530 and a lower housing 532 received in the upper shell 510 and lower shell 512, respectively. The photovoltaic package 502 is provided on the lower housing 532. The photovoltaic package 502 is electrically connected to one or more circuit(s) 534. In an exemplary embodiment, the lower housing 532 represents a circuit board having traces 536 routed along an upper surface thereof to pads 538. A first wire 540 is terminated to the traces 536. The photovoltaic package 502 is mounted to the lower housing 532 such that a bottom of the photovoltaic package 502 is terminated to the pads 538, and thus the first wire 540.

The lower housing 532 includes traces 542 routed along an upper surface thereof to pads 544. A second wire 546 is terminated to the traces 542. The upper housing 530 includes contacts 550 on an inner surface thereof. The contacts 550 are configured to engage the photovoltaic package 502 when the upper housing 530 is closed. For example, the contacts 550 may include spring fingers 551 that engage a top of the photovoltaic package 502. The contacts 550 also include spring fingers 552 that are configured to engage the pads 544 when the socket assembly is assembled. The wires 540, 546 are terminated to the traces 538, 542 separate from the photovoltaic package 502. As such, no permanent connection is made between the wires 540, 546 and the photovoltaic package 502. As such, the photovoltaic package 502 may be removed independently from the wires 540, 546 and without having to alter the wires 540, 546.

In an exemplary embodiment, the lower shell 512 is rotatably coupled to the upper shell 510 at a hinge 556. The lower shell 512 is rotated about the hinge 556 to a closed position. The upper and/or lower shell 510, 512 may include a latch (not shown) to secure the lower shell 512 to the upper shell 510. Optionally, the upper and/or lower shell 510, 512 may include one or more tabs extending therefrom, similar to the tabs 136 (shown in FIGS. 2 and 3), for making thermal engagement with the heat sink 104. The spring fingers 552 may force the lower housing 532 downward, such as against the heat sink 104 (shown in FIG. 1) when mounted thereto.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:
1. A socket assembly comprising:
a photovoltaic package having a substrate with an upper surface and a lower surface, the photovoltaic package having a photovoltaic cell and contact pads on the upper surface, the contact pads being electrically connected to the photovoltaic cell;

flexible wires having discrete contacts terminated to ends thereof, the contacts having separable mating interfaces engaging corresponding contact pads to electrically couple the wires to the photovoltaic package;

a dielectric housing removably receiving the photovoltaic package, the dielectric housing having channels removably receiving the wires and contacts, the dielectric housing holding the contacts in mating engagement with the contact pads, the contacts being deflectable and being spring biased against the contact pads; and a metal shell having an upper wall and side walls defining a chamber receiving the dielectric housing and the photovoltaic package, the metal shell having wire channels open through the side walls, the wires passing through the wire channels into the channels of the dielectric housing, the metal shell having a window through the upper wall providing access to the photovoltaic cell, the metal shell directly engaging the dielectric housing to deflect the contacts and to force the contacts into engagement with the contact pads; wherein the metal shell and dielectric housing both include mounting openings therethrough receiving fasteners for mounting the metal shell, dielectric housing and photovoltaic package to a heat sink such that the photovoltaic package is in direct thermal communication with the heat sink.

2. The socket assembly of claim 1, wherein the channels in the dielectric housing are open at a bottom of the dielectric housing, the wires and contacts being loaded into the channels through the bottom of the dielectric housing.

3. The socket assembly of claim 1, wherein the metal shell includes tabs extending therefrom, the tabs being configured to engage a heat sink, the tabs dissipating heat from the metal shell to the heat sink.

4. The socket assembly of claim 1, wherein the window is aligned with the photovoltaic cell such that the shell shields the housing and the contact pads from above.

5. The socket assembly of claim 1, wherein the upper wall presses against the dielectric housing to force the contacts into engagement with the contact pads.

6. The socket assembly of claim 1, wherein the metal shell is box shaped defining the chamber, the dielectric housing substantially filling the chamber.

7. The socket assembly of claim 1, wherein the metal shell includes window walls extending from the upper wall to define the window, the window walls being angled with respect to the upper wall to the vicinity of the photovoltaic cell.

8. The socket assembly of claim 1, wherein the photovoltaic package includes a latch extending therefrom, the latch engaging the dielectric housing to hold the photovoltaic package with respect to the dielectric housing.

9. The socket assembly of claim 1, wherein the contacts include multiple fingers defining multiple points of contact with the corresponding contact pads.

10. The socket assembly of claim 1, wherein the metal shell includes an upper shell and a lower shell hingedly coupled together, wherein the dielectric housing and the photovoltaic cell are captured between the upper shell and the lower shell.

11. The socket assembly of claim 1, wherein the dielectric housing and photovoltaic package are received in the metal shell such that a bottom of the substrate is flush with a bottom of the metal shell for direct attachment of the substrate to a heat sink.

12. A socket assembly for mounting a photovoltaic package to a heat sink, the socket assembly comprising:

a dielectric housing configured to hold the photovoltaic package, the dielectric housing holding contacts having mating interfaces, the mating interfaces defining a separable interface being configured for mating engagement with contact pads of the photovoltaic package, the contacts being deflectable and being configured to be spring biased against the contact pads, the dielectric housing having mounting openings passing therethrough from a top to a bottom of the dielectric housing; and a metal shell receiving the dielectric housing, the metal shell having an opening along a bottom of the metal shell, the metal shell having mounting openings passing through an upper wall of the metal shell with fasteners passing through the mounting openings of the metal shell and through the mounting openings of the dielectric housing for mounting the bottom of the metal shell to the heat sink, wherein, when the fasteners are secured to the heat sink, the metal shell directly engaging the dielectric housing and pressing the dielectric housing downward against the heat sink, such downward pressure causing the dielectric housing to deflect the contacts and to force the contacts into engagement with the contact pads, wherein downward pressure of the dielectric housing holds the photovoltaic package in the opening of the metal shell along the bottom such that the photovoltaic package is pressed in direct thermal communication with the heat sink.

13. The socket assembly of claim 12, wherein the metal shell includes tabs extending therefrom, the tabs being configured to engage a heat sink, the tabs dissipating heat from the metal shell to the heat sink.

14. The socket assembly of claim 12, wherein the dielectric housing includes a chamber configured to receive the photovoltaic package therein, the metal shell further including a window aligned with an exposed portion of the chamber, the portion of the metal shell surrounding the window shielding a shielded portion of the chamber from above.

15. The socket assembly of claim 12, wherein the metal shell includes window walls extending from the upper wall to define a window configured to expose the photovoltaic cell of the photovoltaic package, the window walls being angled with respect to the upper wall to the vicinity of the photovoltaic cell.

16. A socket assembly comprising:

a photovoltaic package having a substrate with an upper surface and a lower surface, the photovoltaic package having a photovoltaic cell and contact pads electrically connected to the photovoltaic cell on the upper surface, the lower surface being configured to be in direct thermal communication with a heat sink, the lower surface being unsoldered to the heat sink and being removable from the heat sink;

a dielectric housing holding the photovoltaic package, the dielectric housing having a top and a bottom receiving the photovoltaic package, the dielectric housing holding contacts directly vertically above and in mating engagement with the contact pads on the upper surface of the substrate, the contacts being deflectable and being spring biased against the contact pads, the dielectric housing having mounting openings passing therethrough from the top to the bottom of the dielectric housing; and a metal shell receiving the housing and the photovoltaic package, the metal shell having mounting openings passing through an upper wall of the metal shell with fasteners passing through the mounting openings of the metal shell and through the mounting openings of the dielectric housing for mounting the metal shell, dielectric housing and photovoltaic package to the heat sink such that the photovoltaic package is in direct thermal communication with the heat sink, wherein, when the fasteners are secured to the heat sink, the metal shell directly engaging the dielectric housing and pressing the dielectric housing downward against the heat sink, such downward pressure causing the dielectric housing to deflect the contacts and to force the contacts into engagement with the contact pads, and wherein when the fasteners are removed the metal shell, dielectric housing and photovoltaic package are all removable from the heat sink.

17. The socket assembly of claim 16, wherein the metal shell includes tabs extending therefrom, the tabs being configured to engage the heat sink, the tabs dissipating heat from the metal shell to the heat sink.

18. The socket assembly of claim 16, wherein the dielectric housing includes a chamber configured to receive the photovoltaic package therein, the metal shell further including a window aligned with an exposed portion of the chamber, the portion of the metal shell surrounding the window shielding a shielded portion of the chamber from above.

19. The socket assembly of claim 16, wherein the metal shell includes an upper wall, the upper wall presses against the dielectric housing to force the contacts into engagement with the contact pads.

* * * * *